United States Patent
Mochizuki

(10) Patent No.: US 7,102,676 B1
(45) Date of Patent: Sep. 5, 2006

(54) IMAGE PICK-UP APPARATUS AND IMAGE PICK-UP SYSTEM, AND METHOD FOR MANUFACTURING IMAGE PICK-UP APPARATUS

(75) Inventor: Chiori Mochizuki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/422,792

(22) Filed: Oct. 22, 1999

(30) Foreign Application Priority Data

Oct. 28, 1998 (JP) .................... 10-307033

(51) Int. Cl.
*H04N 5/335* (2006.01)
*H01L 27/146* (2006.01)

(52) U.S. Cl. .......... 348/307; 348/308; 250/370.11; 250/370.09

(58) Field of Classification Search ........ 348/307, 348/302, 304, 222.1, 308; 250/208.5, 367, 250/307
See application file for complete search history.

(56) References Cited

U.S. PATENT DOCUMENTS

| | | | | |
|---|---|---|---|---|
| 4,011,454 A | * | 3/1977 | Lubowski et al. | 250/483.1 |
| 5,032,718 A | * | 7/1991 | Murakami | 250/227.2 |
| 5,060,040 A | * | 10/1991 | Saika et al. | 257/53 |
| 5,187,369 A | | 2/1993 | Kingsley et al. | 250/370.11 |
| 5,262,649 A | | 11/1993 | Antonuk et al. | 250/370.09 |
| 5,381,014 A | | 1/1995 | Jeromin et al. | |
| 5,420,452 A | * | 5/1995 | Tran et al. | 257/428 |
| 5,430,298 A | * | 7/1995 | Possin et al. | 250/370.11 |
| 5,463,420 A | * | 10/1995 | Yamada | 348/294 |
| 5,572,034 A | * | 11/1996 | Karellas | 250/368 |
| 5,700,333 A | * | 12/1997 | Yamazaki et al. | 136/258 |
| 5,739,548 A | * | 4/1998 | Shigeta et al. | 257/59 |
| 5,793,047 A | * | 8/1998 | Kobayashi et al. | 250/370.09 |
| 5,812,109 A | * | 9/1998 | Kaifu et al. | 345/104 |
| 5,866,905 A | * | 2/1999 | Kakibayashi et al. | 250/311 |
| 6,271,525 B1 | * | 8/2001 | Majewski et al. | 250/367 |
| 6,476,867 B1 | * | 11/2002 | Kobayashi et al. | 348/307 |
| 6,545,711 B1 | * | 4/2003 | Perner et al. | 348/294 |
| 6,570,164 B1 | * | 5/2003 | Mooney | 250/397 |

FOREIGN PATENT DOCUMENTS

| | | |
|---|---|---|
| EP | 0 555 907 A1 | 3/1993 |
| EP | 0 932 053 A1 | 7/1999 |
| FR | 2 758 654 | 7/1998 |
| JP | 5-180945 | 7/1993 |
| JP | 07-027863 | 1/1995 |
| WO | WO 98/36290 | 2/1998 |
| WO | WO 98/36290 | 8/1998 |

OTHER PUBLICATIONS

European Office Action in Application No. 99 308 455.7—1235 dated Aug. 10, 2005.

* cited by examiner

*Primary Examiner*—Lin Ye
(74) *Attorney, Agent, or Firm*—Fitzpatrick, Cella, Harper & Scinto

(57) ABSTRACT

A scintillator layer for converting an incident radiation into a light having a wavelength detectable with a photoelectric conversion element is provided on a sensor substrate on which plural photoelectric conversion elements and switching elements are disposed via a flattening layer.

28 Claims, 14 Drawing Sheets

IMAGE PICK-UP APPARATUS AND IMAGE PICK-UP SYSTEM, AND METHOD FOR MANUFACTURING IMAGE PICK-UP APPARATUS

BACKGROUND OF THE INVENTION

1. Field of the Invention

The present invention relates to an image pick-up apparatus and an image pick-up system, and a method for manufacturing the image pick-up apparatus. The present invention relates, for example, to an image pick-up apparatus provided with a scintillator layer for converting an incident radiation such as X-ray to a light having a wavelength detectable with the photoelectric conversion element on a sensor substrate on which plural pairs of a photoelectric conversion element and switching element are disposed, and an image pick-up system, and a method for manufacturing the image pick-up apparatus.

2. Description of the Related Art

A system for converting a radiation such as X-ray into a light having a wavelength in a sensing region with a scintillator and for converting the light into an electric signal with an image sensor to store and transfer as an image data is noticed in the fields of medical inspection and nondestructive testing.

An image pick-up apparatus is disclosed in Japanese Patent Laid-open No. 7-27863 as an example of the image pick-up apparatus such as a radiation image pick-up apparatus for use in the system as described above, wherein CsI is used for the scintillator material for converting X-ray into a light and the CsI elements are disposed on a two-dimensional substrate.

Meanwhile, high sensitivity is required for the image pick-up apparatus for completing the medical inspection and nondestructive testing within a short period of time in order to reduce X-ray dosage to the testing subjects and human body by taking the effect of radiation into considering.

Accordingly, development of an image pick-up apparatus that can efficiently convert a radiation such as X-ray into an electric signal is desired.

SUMMARY OF THE INVENTION

Accordingly, the object of the present invention is to provide an image pick-up apparatus for enabling it to be highly sensitive and a method for manufacturing the same, and an image pick-up system.

An another object of the present invention is to provide an image pick-up apparatus having a wavelength converter with excellent characteristics and a method of for manufacturing the same, and an image pick-up system.

An additional object of the present invention is to provide an image pick-up apparatus having a high reliability and improved durability and a method for manufacturing the same, and an image pick-up system.

An another object of the present invention is to provide an image pick-up apparatus being able to increase substantial aperture of pixels of the image pick-up apparatus for making sensitivity of the apparatus high and enhancing reading speed and a method for manufacturing the same, and an image pick-up system.

In a first aspect, the present invention provides an image pick-up apparatus comprising a wavelength converter for converting an incident radiation to a light having a wavelength detectable with a photoelectric conversion element on a sensor substrate on which plural photoelectric conversion elements and a switching elements are disposed, wherein a flattening layer having a flat face making a contact with the wavelength converter is provided between the sensor substrate and wavelength converter.

In accordance with another aspect of the present invention, the present invention provides an image pick-up apparatus comprising plural sensor substrates on which plural photoelectric conversion elements and switching elements are disposed, wherein the plural sensor substrates comprise flattening layers and a wavelength converter is provided on each flattening layer.

In accordance with a further aspect of the present invention, the present invention provides an image pick-up apparatus comprising a wavelength converter for converting an incident radiation into a light having a wavelength detectable with the photoelectric conversion element on a sensor substrate comprising plural photoelectric elements and switching elements, wherein a flattening layer having a flat plane making a contact with the wavelength converted is provided between the sensor substrate and scintillator layer; or image pick-up apparatus comprising plural sensor substrates on which plural photoelectric conversion elements and switching elements are disposed, a flattening layer being provided on the plural sensor substrates and the wavelength converter being provided on the flattening layer; and an image pick-up system comprising a signal processing device for processing the signal from the image pick-up apparatus, a recording device for recording the signal from the image processing device, and a display device for displaying the signal from the image processing device.

In accordance with another aspect of the present invention, the present invention provides a method for manufacturing an image pick-up apparatus comprising the steps of: forming a protective layer on a sensor substrate comprising plural photoelectric conversion elements and switching elements; forming a flattening layer having a flat surface on the protective layer; and forming a wavelength converter on the flattening layer.

In accordance with another aspect of the present invention, the present invention provides a method for manufacturing an image pick-up apparatus comprising the steps of: forming a protective layer on a sensor substrate comprising plural photoelectric conversion elements and switching elements, flattening the surface of the protective layer; and forming a wavelength converter on the flattened protective layer.

In accordance with another aspect of the present invention, the present invention provides a method for manufacturing an image pick-up apparatus comprising the steps of: providing a flattening layer on plural sensor substrates after disposing the plural sensor substrates comprising plural photoelectric conversion elements and switching elements; and providing a wavelength converter on the flattening layer.

DESCRIPTION OF THE PREFERRED EMBODIMENT

Examples of the sensor substrate shown in FIG. 1 and FIG. 2 applied to the present invention will be described below.

Figure 1:
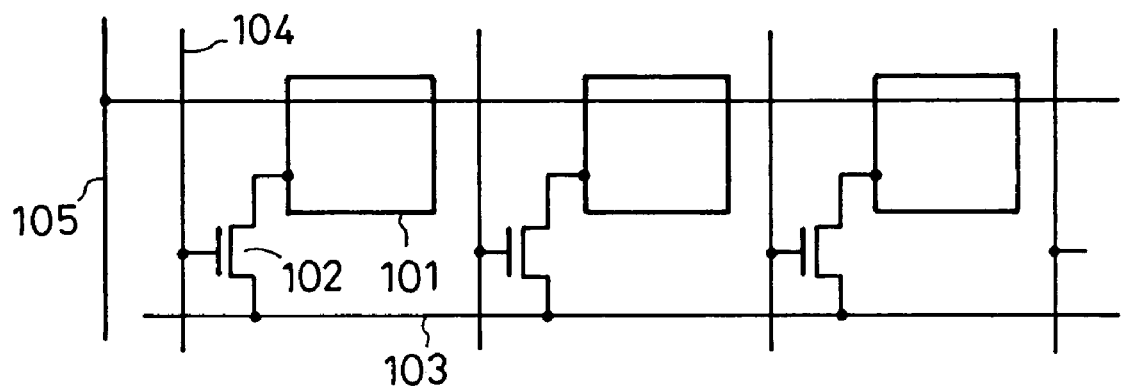
FIG. 1 illustrates an equivalent circuit diagram of the sensor provided on the sensor substrate.
Figure 2:
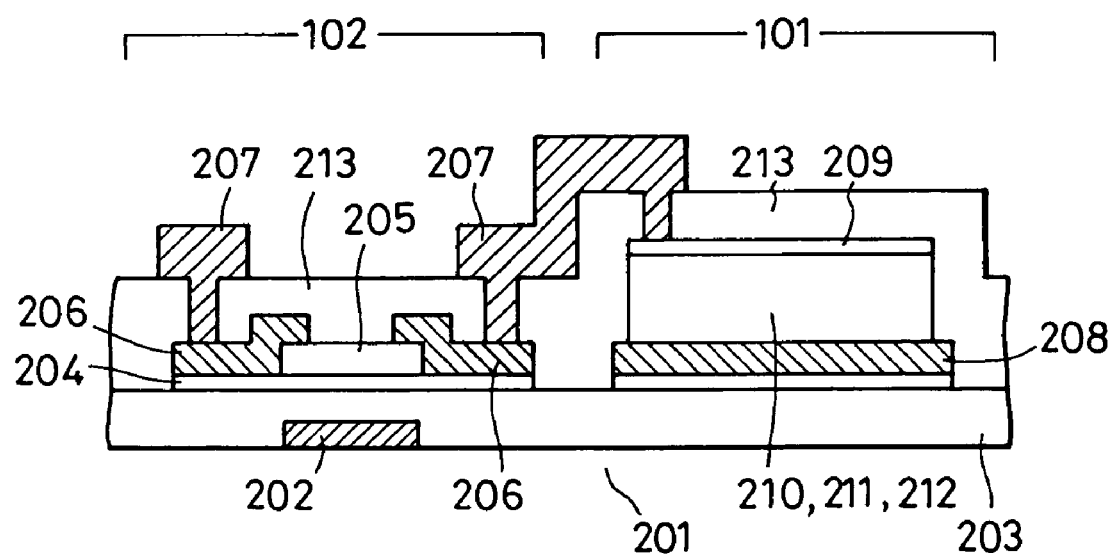
FIG. 2 denotes a schematic cross section of the sensor.

The reference numerals 101 and 102 in FIG. 1 and FIG. 2 denote a PIN type photodiode and a TFT, respectively. The PIN type photodiode 101 and TFT 102 differ in their layer construction and film thickness with each other as is evident from FIG. 2 (detailed constructions will be described hereinafter), causing a large step on the surface of the sensor substrate at the boundary between the TFT and photodiode.

When a non-single crystalline semiconductor, for example an amorphous silicon film (a-Si film) is used for a sensor material and Al is used for a wiring material, a SiN protective film is deposited under restricted deposition temperatures. Accordingly, covering the steps on the surface of the sensor substrate involves some problems to be investigated, although the surface steps remain even after the steps on the surface has been appropriately covered.

According to the studies by the inventors of the present invention, growth of CsI crystals becomes poor at the steps on bias lines of the PIN type photodiode and peripheral areas, forming distorted crystals to cause decrease of substantial aperture ratio, when a scintillator made of, for example, CsI is formed on the stepped surface. The inventors of the present invention have succeeded in obtaining a scintillator layer having good crystallinity by flattening the surface where the CsI scintillator layer is to be formed.

The difference between the invention described in Japanese Patent Laid-open No. 7-27863 and the present invention will be then described. Japanese Patent Laid-open No. 7-27863 discloses that concave or convex patterns are formed on the substrate to generate cracks at a designated site for forming the scintillator when the scintillator is formed on the substrate. However, it is not disclosed in the patent publication that the steps adversely affect crystallinity of the scintillator layer to decrease its aperture ratio, so that the surface adjoining to the scintillator layer should be flattened in order to alleviate the effect of the step.

The term "radiation" in the present invention refers to a particle beam or an electromagnetic wave, and the term "scintillator" refers to a substance that converts the particle beam or electromagnetic wave into a light having a wavelength detectable with a photoelectric conversion element. The present invention is advantageously used for X-ray that is used in the medical inspection and non-destructive testing.

Examples according to the present invention will be described hereinafter in detail with reference to the drawings. The examples below describe a X-ray image pick-up apparatus as an example of the image pick-up apparatus.

EXAMPLE 1

The first example of the present invention will be described with reference to a sensor substrate making use of a PIN type photosensor as the photoelectric conversion element and a TFT as a switching element.

Figure 3A:
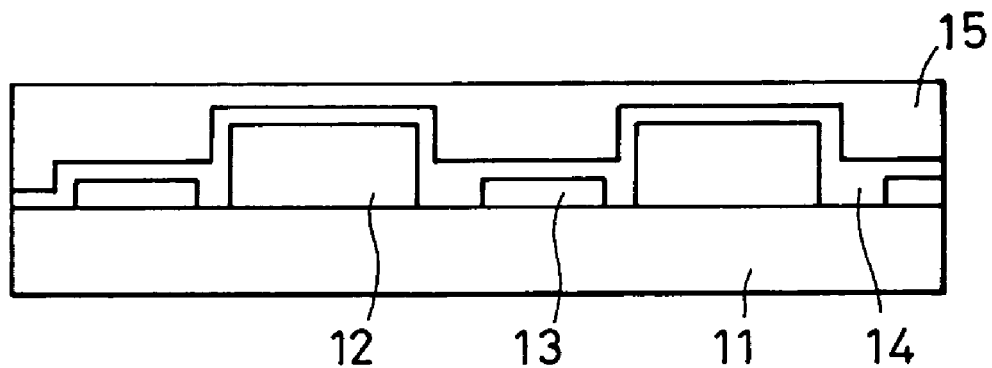
FIG. 3A denotes a schematic cross section for describing one example of the manufacturing step of the image pick-up apparatus.
Figure 3B:
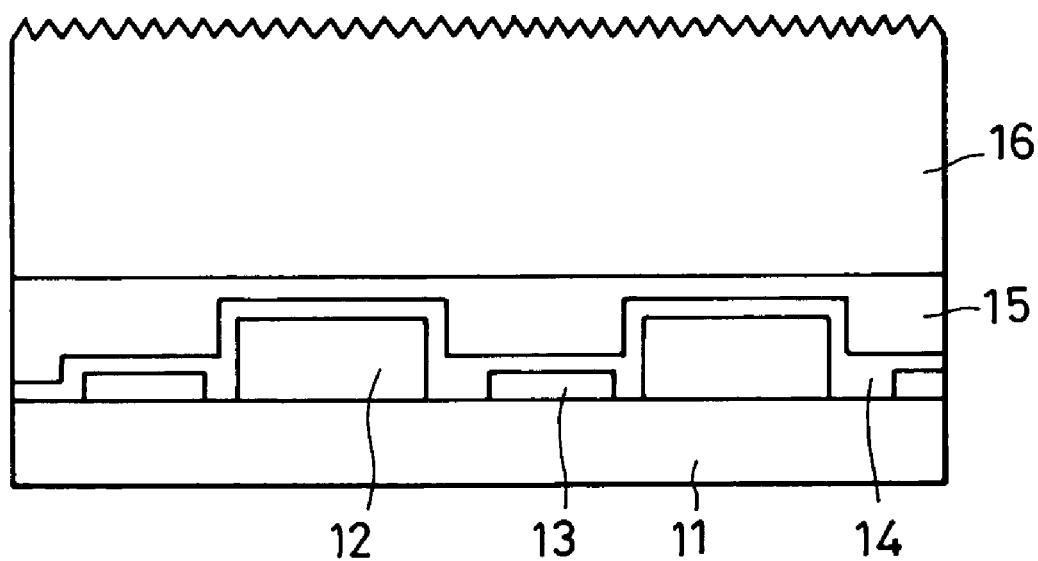
FIG. 3B denotes a schematic cross section for describing another example of the manufacturing step of the image pick-up apparatus.

FIG. 3A and FIG. 3B denote schematic cross sections for describing examples of the manufacturing steps of the X-ray image pick-up apparatus in Example 1 according to the present invention.

As shown in FIG. 3A, a photoelectric conversion element 12 and TFT 13 comprising the PIN type photodiode are formed on a glass substrate 11, on which a SiN protective film 14 is deposited for stabilizing characteristics of the devices.

FIG. 1 illustrates an equivalent circuit diagram and FIG. 2 show a schematic cross section of the sensor substrate. The reference numeral 101 denotes the PIN type photodiode, the reference numeral 102 denotes the TFT, the reference numeral 103 denotes a signal line, the reference numeral 104 denote a gate line and the reference numeral 105 denote a sensor bias line in FIG. 2.

The reference numeral 201 denotes the glass substrate, the reference numeral 202 denotes the gate line, the reference numeral 203 denotes a gate insulation film, the reference numeral 204 denotes an i-type a-Si active layer, the reference numeral 205 denotes a SiN film, the reference numeral 206 denotes a n$^+$-type ohmic contact layer, the reference numeral 207 denotes a SD (source-drain) electrode, the reference numeral 208 denotes a lower sensor electrode, the reference numerals 210, 211 and 212 denote p-, i- and n-type Si layers, respectively, the reference numeral 209 denotes a sensor upper electrode, and the reference numeral 213 denotes a SiN protective film in FIG. 2.

The TFT employs an inverse stagger type TFT composed of the SiN gate insulation layer, i-type a-Si active layer and n$^+$-ohmic contact layer as shown in FIG. 2 in the present invention. The PIN type photodiode is composed of, on the other hand, the p-type a-Si layer, i-type a-Si layer and n-type a-Si layer. In other words, the layer constructions differ between the TFT and PIN type photodiode, consequently forming large surface steps among functional elements on the sensor substrate.

The SiN protective layer 14 is usually formed on the sensor substrate having the construction as described above for stabilizing the device characteristics.

A polyimide layer as a flattening layer 15 was then coated using a spinner as shown in FIG. 3A. Semicofine (LP-62 usually having a viscosity of 600 to 1,000 cps with a solid fraction of 16.5 to 18.5%) made by Torey Co. was used as the polyimide resin. The spin coat conditions were 50 (rpm)/30 (sec) for the first coating and X (rpm)/60 (sec) for the second coating (X=viscosity (cps)×solid fraction (%)× 0.0563).

The flattening layer can be also formed by a screen printing method, roll coater method, spray method, and spray and spin coating method. CsI is deposited thereafter to form a scintillator layer 16 (FIG. 3B). CsI was grown as a columnar crystal in this example since the scintillator may be expected to have higher sensitivity and crosstalk can be reduced. A CsI crystal having good crystallinity could be obtained in this example by flattening the CsI deposition face by forming a flattening layer 15.

EXAMPLE 2

An Al film was coated as a light reflection film (also serves as a protective film) in the second example of the present invention besides flattening the surface of the CsI layer as described in the first example.

Figure 4A:
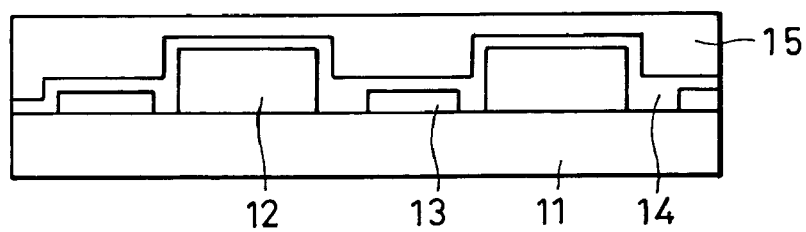
FIG. 4A denotes a schematic cross section for describing another example of the manufacturing step of the image pick-up apparatus.
Figure 4B:
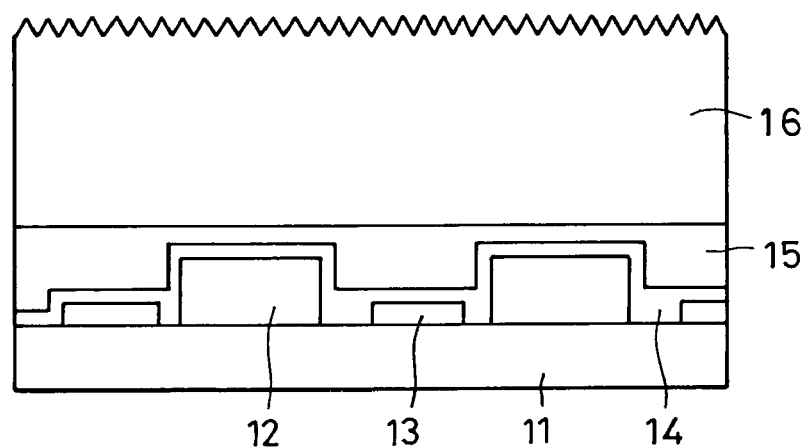
FIG. 4B denotes a schematic cross section for describing another example of the manufacturing step of the image pick-up apparatus.
Figure 4C:
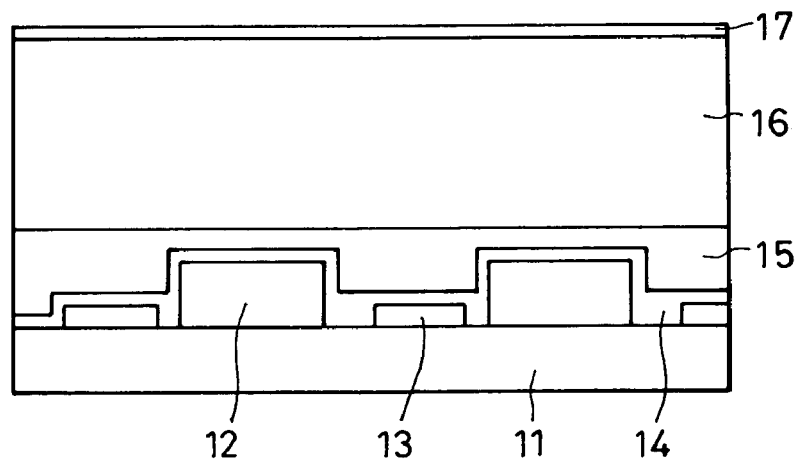
FIG. 4C denotes a schematic cross section for describing another example of the manufacturing step of the image pick-up apparatus.

FIG. 4A to FIG. 4C denote schematic cross sections showing examples of the manufacturing steps of the X-ray image pick-up apparatus in the second example according to the present invention.

In the lamination step of CsI shown in FIG. 4B, the apparatus is manufactured by the same manufacturing steps explained using FIG. 3A and FIG. 3B.

Figure 5:
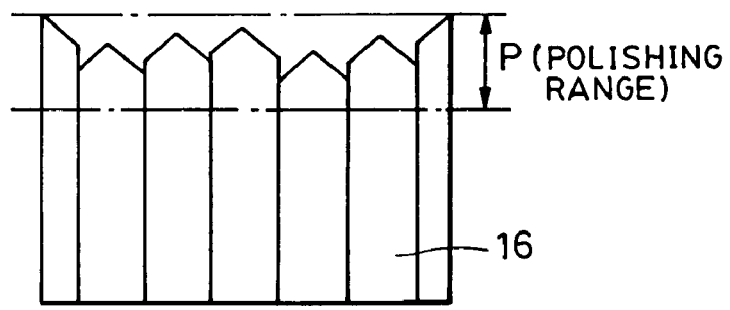
FIG. 5 denotes a schematic cross section for describing the polishing area.

The surface of the laminated CsI 16 was then flattened. When CsI had been grown as columnar crystals, the surface becomes rough with a roughness of several microns to several tens microns. The surface was flattened using a polyurethane abrasive cloth and silica abrasive in this example in order to uniformly form the reflection film or moisture protective film with good coverage. FIG. 5 denotes a schematic cross section showing the polishing area P. Flattening is also possible using photolithography such as an etch-back method.

An Al film 17 serving as the reflection film and protective film was completed thereafter (FIG. 4C).

EXAMPLE 3

The Al film was formed after forming the polyimide film as a flattening layer on the CsI layer (the scintillator layer 16) in Example 3 of the present invention, instead of polishing the CsI layer as in the second example.

Figure 6:
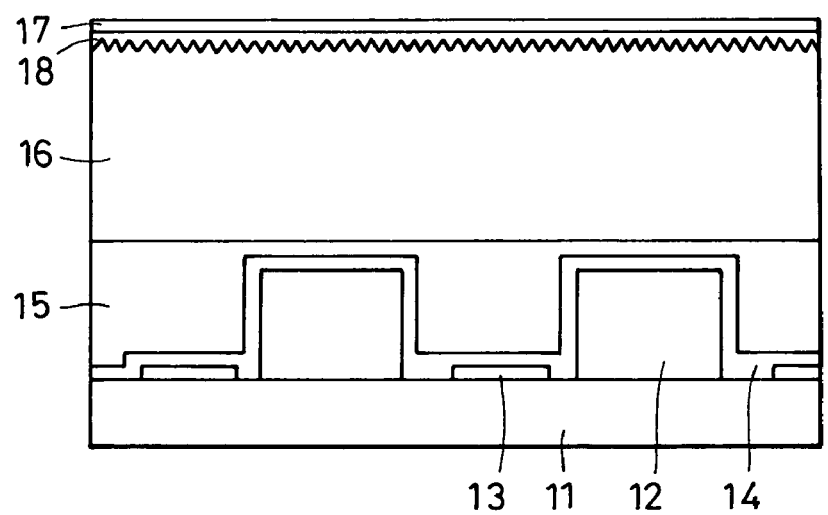
FIG. 6 denotes a schematic cross section of the image pick-up apparatus.

FIG. 6 shows a schematic cross section showing the construction of the X-ray image pick-up apparatus in Example 3 according to the present invention.

The same manufacturing steps as described in Example 1 with reference to FIG. 3A and FIG. 3B are used until the CsI lamination step for manufacturing the X-ray image pick-up apparatus according to the present example.

Figure 7:
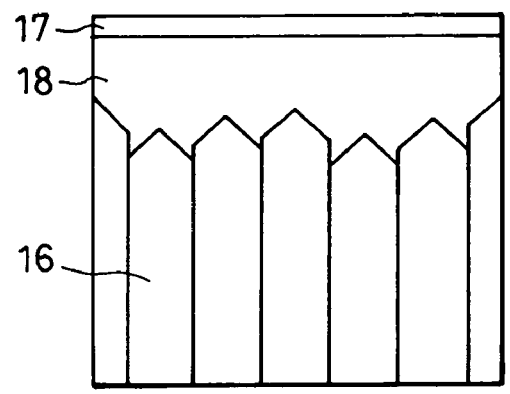
FIG. 7 illustrates an example for flattening the surface of the scintillator.

Then, the polyimide layer as a flattening layer is coated on the laminated CsI layer 16 using a spinner. The surface is flattened by coating a polyimide film with a roughness of several microns to several tens microns when CsI is grown as columnar crystals as described above. The Al film serving as the reflection film and protective film was further formed in order to uniformly form the reflection film or moisture protective film with good coverage. FIG. 7 shows a schematic cross section after forming the polyimide film as a flattening layer and the Al film.

Figure 8A:
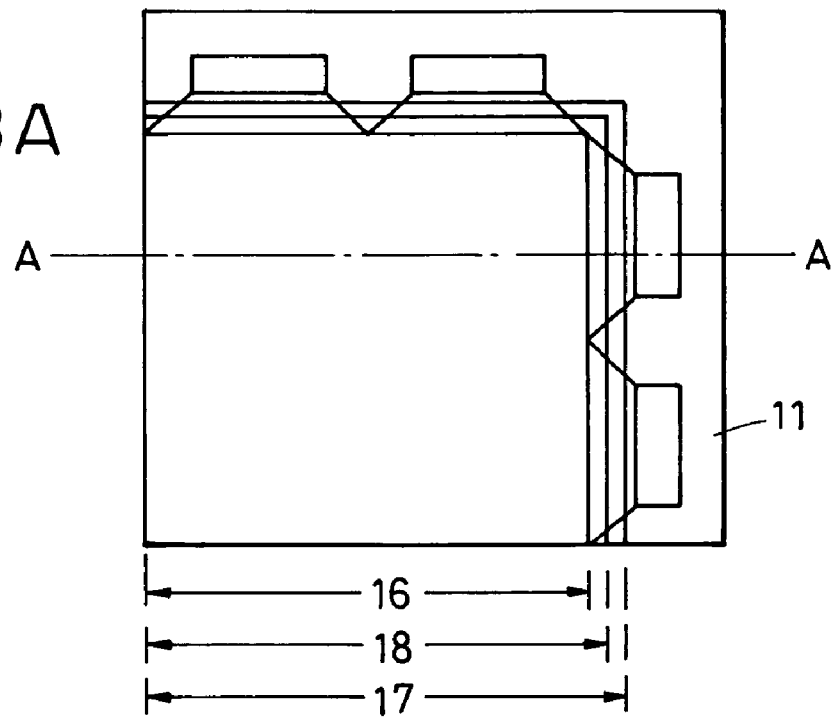
FIG. 8A denotes a schematic plane view for describing an example of the periphery of the image pick-up apparatus.
Figure 8B:
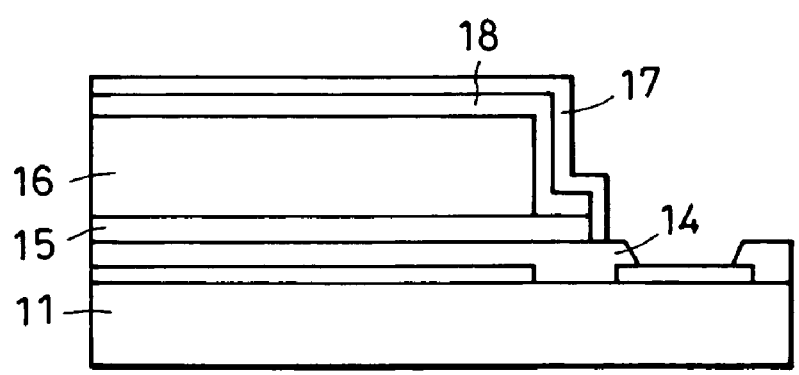
FIG. 8B denotes a schematic cross section for describing an example of the end face of the image pick-up apparatus.
Figure 9A:
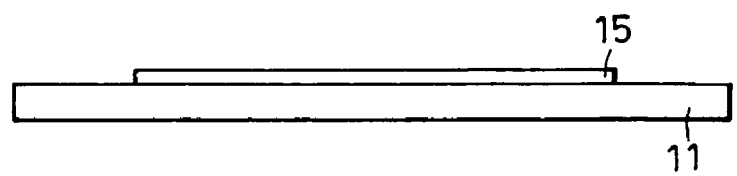
FIG. 9A denotes a schematic cross section for describing an example of the fabrication step of the image pick-up apparatus.
Figure 9B:
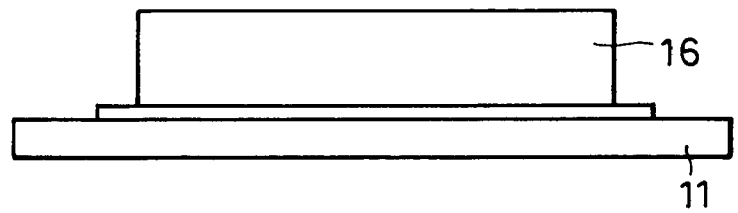
FIG. 9B denotes a schematic cross section for describing an example of the fabrication step of the image pick-up apparatus.
Figure 9C:
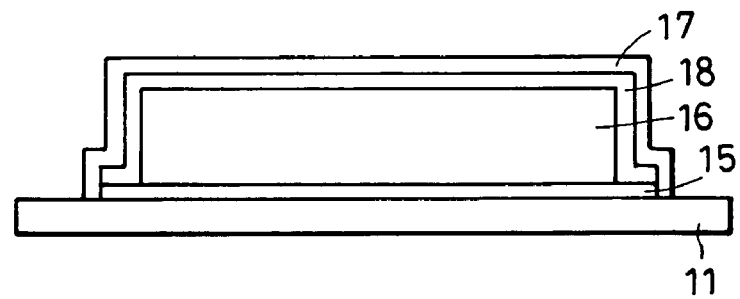
FIG. 9C denotes a schematic cross section for describing an example of the fabrication step of the image pick-up apparatus.
Figure 9D:
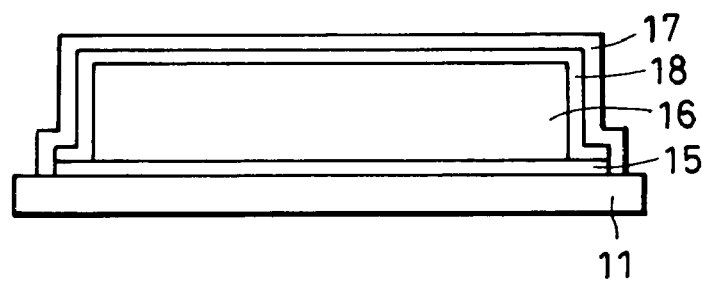
FIG. 9D denotes a schematic cross section for describing an example of the fabrication step of the image pick-up apparatus.

The polyimide film 18 and Al film 17 are also formed on the end faces of the scintillator layer 16 as shown in FIG. 8A and FIG. 8B in this example. The CsI crystals to serve as the scintillator layer 16 are packaged with the polyimide film 15 serving as a first flattening layer and the polyimide film 18 serving as a second flattening layer. In addition, the first and second flattening layers are packaged with the Al film 17 to serve as the moisture protective film. Such construction allows, for example, the CsI crystals constituting the scintillator layer 16 to be protected from ambient atmosphere such as moisture, improving their durability.

FIG. 9A to FIG. 9D illustrate the manufacturing steps when the polyimide film 18 and Al film 17 are formed on the end face of the scintillator layer 16 on the sensor substrate.

EXAMPLE 4

The same effects can be obtained by covering the sensor substrate including the scintillator layer with a metal foil such as an aluminum foil, instead of the end face treatment as shown in Example 3.

Figure 10:
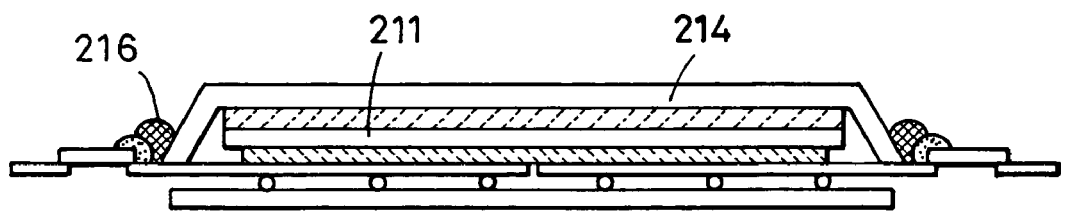
FIG. 10 illustrates an another example of the image pick-up apparatus.
Figure 11:
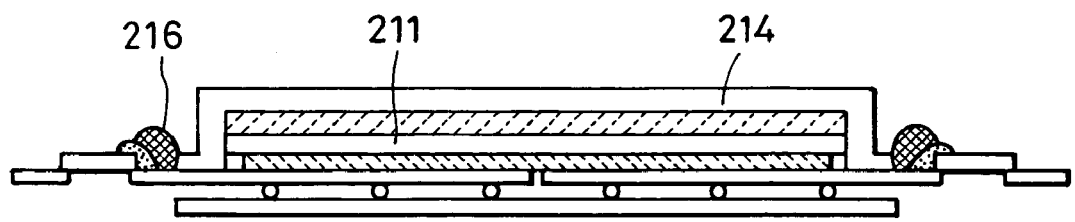
FIG. 11 illustrates another example of the image pick-up apparatus.

FIG. 10 and FIG. 11 show a schematic cross sections of the X-ray image pick-up apparatus in which the sensor substrate including the scintillator layer is covered after forming the scintillator layer on the flattened sensor substrate. The metal foil 214 is drawn so as to cover the end face of the scintillator layer 211 with inclined faces, and the edge of the foil is bent downward for sealing a part of the sensor substrate with a resin seal 216. Moisture can be prevented from permeating with an organic or inorganic resin seal 216 in this construction, while protecting the scintillator layer 211 from permeation of moisture by virtue of spaces formed between the metal foil 214 and scintillator layer 211.

The metal foil 214 is bent along the end face of the scintillator layer 214 in FIG. 11, thereby sealing the circumference of the scintillator layer with the resin seal 216 comprising the organic or inorganic resin. Since the end face of the scintillator layer is covered with a metal in this construction, permeation of moisture into the scintillator layer can be prevented.

EXAMPLE 5

The CsI deposition surface is flattened by polishing the SiN protective film by CMP (chemical mechanical polishing) in Example 5, instead of using the polyimide film as in Example 3 and Example 4 described above.

Figure 12A:
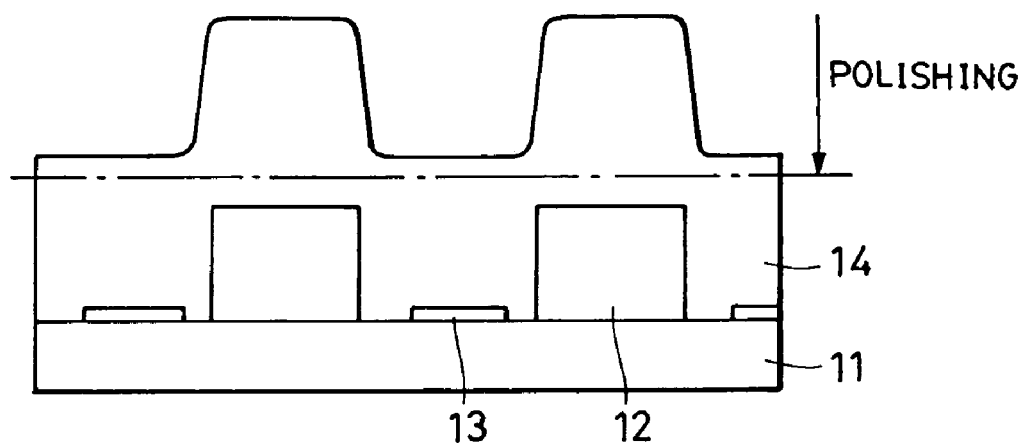
FIG. 12A denotes a schematic cross section for describing an example of the manufacturing step of the image pick-up apparatus.
Figure 12B:
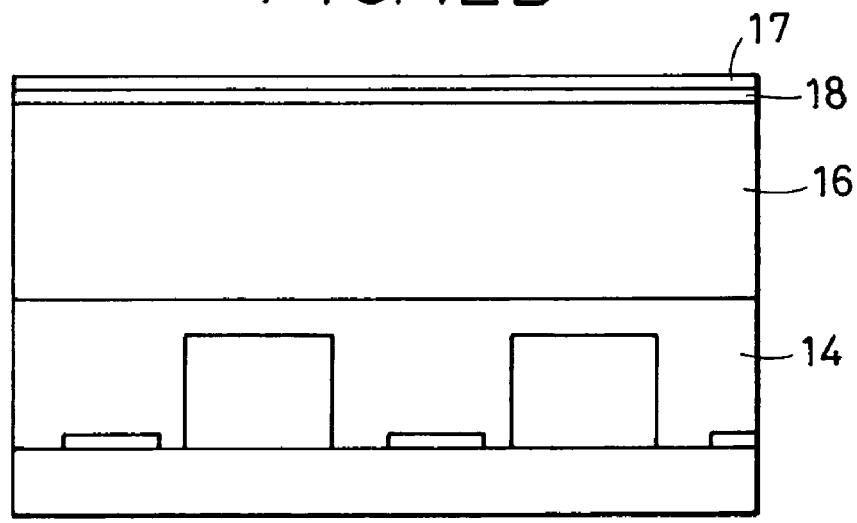
FIG. 12B denotes a schematic cross section for describing another example of the manufacturing step of the image pick-up apparatus.

FIG. 12A and FIG. 12B show schematic cross sections for describing examples of the manufacturing steps of the X-ray image pick-up apparatus in Example 5 according to the present invention. Since this example is the same as the manufacturing steps in Example 3, except that the SiN protective film is polished for flattening the CsI deposition surface instead of forming the polyimide film, the polishing step is mainly described.

As shown in FIG. 12A, the SiN protective film 14 is flattened by polishing by CMP after forming the SiN protective film 14 so as to fill the surface roughness caused by the PIN type photodiode 12 and TFT 13. The CsI layer 16, polyimide film 18 as a flattening layer and Al film 17 to serve as a moisture protective film are formed thereafter by the same method in Example 3 as shown in FIG. 12B. A $SiO_2$ film may be used as the protective film 14.

While it is desirable for some portions of the protective film 14 that protect the PIN type photodiode 12 and TFT 13 to form a minute film so that characteristics of the PIN type photodiode and TFT are not adversely affected, such films are not necessarily formed on the portions merely to be flattened.

EXAMPLE 6

Figure 13A:
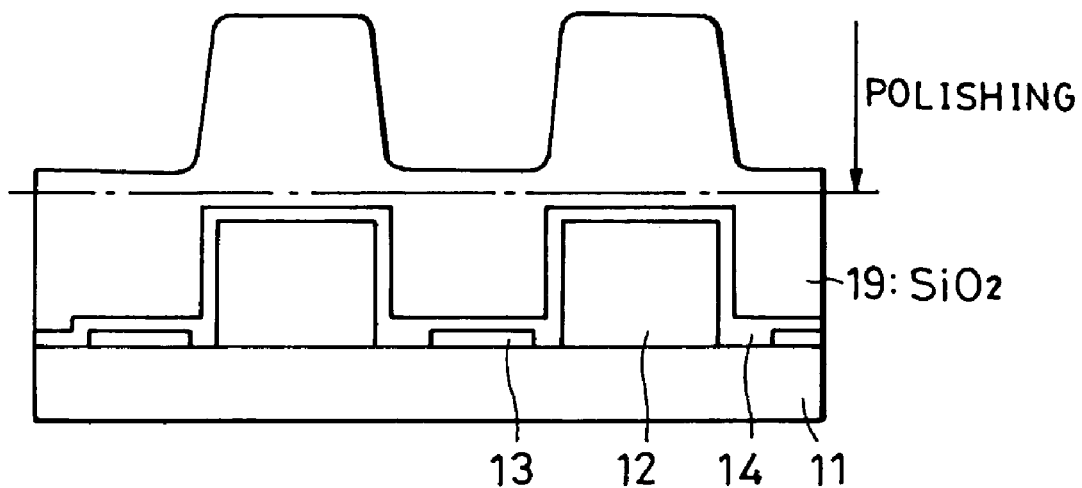
FIG. 13A denotes a schematic cross section for describing an example of the manufacturing step of the image pick-up apparatus.
Figure 13B:
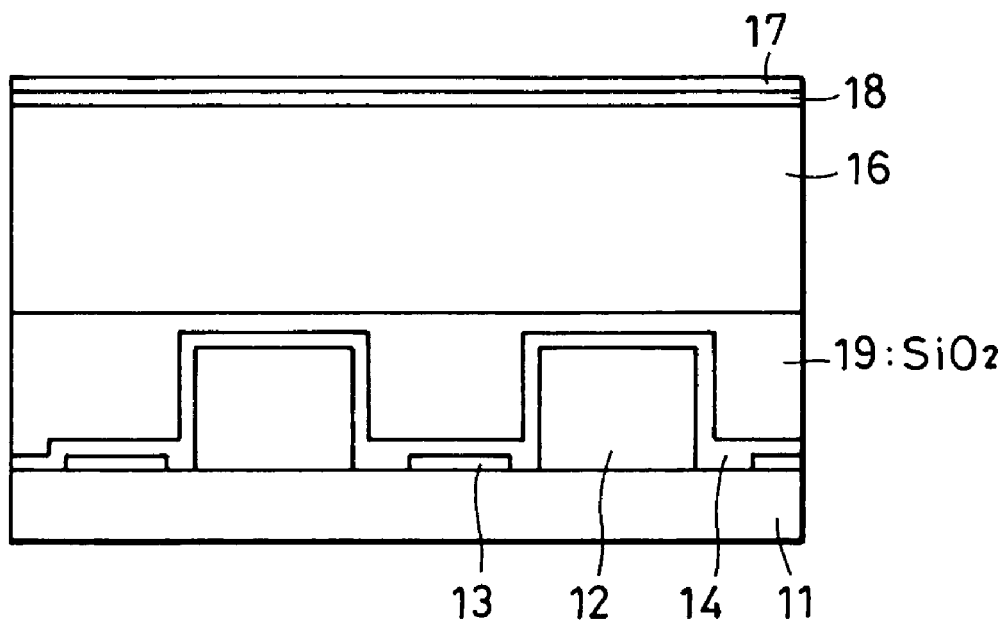
FIG. 13B denotes a schematic cross section for describing another example of the manufacturing step of the image pick-up apparatus.

FIG. 13A and FIG. 13B demonstrates schematic drawings when the portions for protecting the PIN type photodiode 12 and TFT 13 are formed of the minute first protective film 14 so as not to adversely affect their characteristics, while the portions for filling the rough portions are formed of the second protective layer 19 comprising the materials that can be readily polished and having a high deposition speed.

A SiN film and $SiO_2$ film may be formed as the first protective film 14 and a second protective film 19, respectively, or the first protective film 14 and second protective film 19 may be formed using the same film material (SiN film or $SiO_2$ film) but changing the deposition method and deposition condition. Examples of the method for forming the first protective film 14 and second protective film 19 using the same material but changing the manufacturing conditions comprise depositing the first protective film 14 by a CVD method using a mixed gas of $H_2$, $N_2$ and $SiH_4$, and depositing the second protective film 19 by a CVD method using a mixed gas of $H_2$, $NH_3$ and $SiH_4$, thereby making it possible to form the protective films without adversely affecting the characteristics of the PIN type photodiode while improving the deposition speed. Examples of the method for forming the first protective film 14 and second protective film 19 by changing respective manufacturing methods comprise depositing the first protective film by a CVD method using a mixed gas of $H_2$, $N_2$ and $SiH_4$, and depositing the second protective film by a sputtering method.

Of course, it is preferable to protect the scintillator layer in Examples 5 and 6 as in Examples 3 and 4.

While the X-ray image pick-up apparatus using one sheet of the sensor substrate was described in Examples 1 to 6, plural sensor substrates may be packaged in adjoining relation with each other in order to form a more larger area of the X-ray image pick-up apparatus when the size of one sensor substrate is limited. An example of a large area X-ray image pick-up apparatus packaged by bonding plural substrates is described with reference to FIG. 14 and FIG. 15.

The sensor substrate 20 comprises a PIN type photodiode, TFT and a first SIN protective layer, on which a first polyimide flattening layer 15, a scintillator layer 16 such as a CsI layer, a second polyimide flattening layer 18 and an Al reflection layer 17 are provided. A second SiN protective layer (not shown) may be further provided on the Al reflection layer 17. The second SiN protective film may be provided for protecting the Al reflection film from being corroded during cutting off the sensor substrate.

Figure 14:
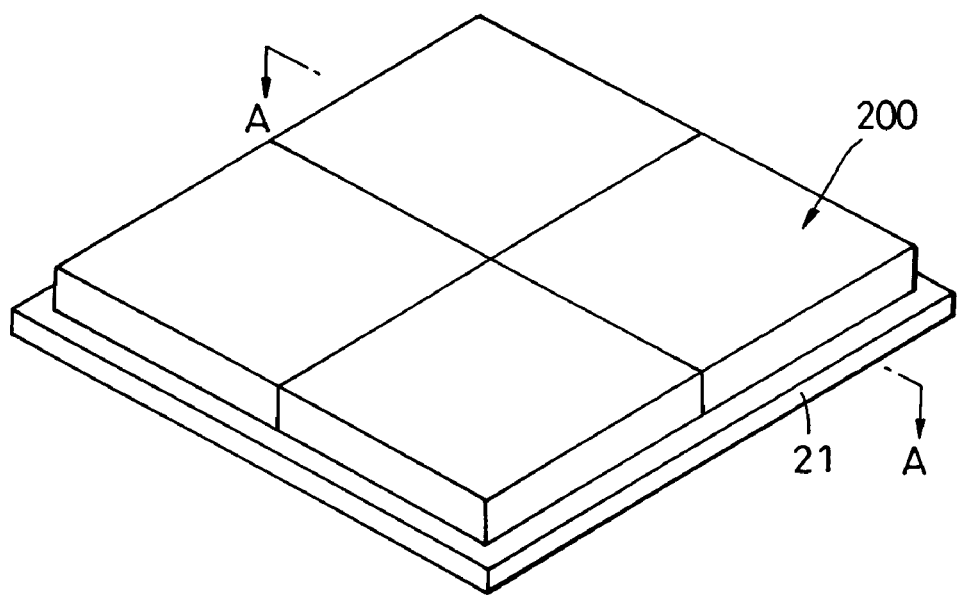
FIG. 14 denotes a schematic perspective view for describing another example of the image pick-up apparatus.

The image pick-up device 200 having the construction as described above is cut-off with a diamond blade, and cut-off pieces were bonded on a substrate 21 with an adhesive 201 so as to dispose each piece in adjoining relation with each other as show in FIG. 14.

Figure 15:
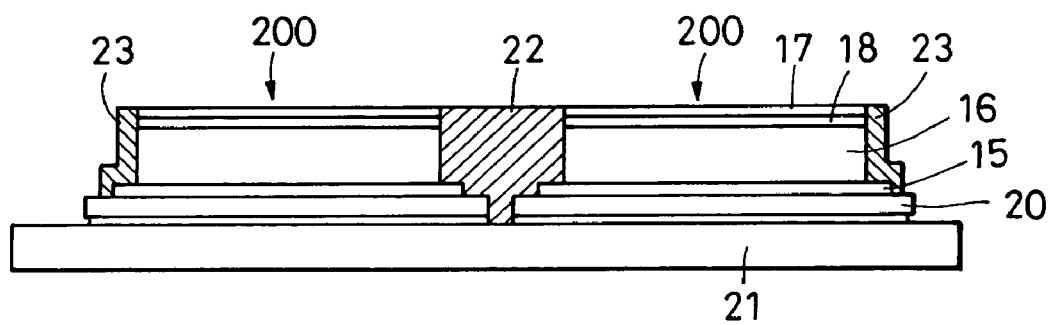
FIG. 15 denotes a schematic cross section of the image pick-up apparatus illustrated in FIG. 14.

FIG. 15 shows a schematic cross section along the line A—A in FIG. 14. As shown in FIG. 15, a black resin 22 is filled into the gaps among the image pick-up devices in order to prevent optical crosstalk of the light whose wavelength has been converted with the scintillator. It is desirable to cover the end face of the sensor substrate with a resin 23 such as an epoxy resin when the end face is exposed. The gap between the image pick-up devices 200 is drawn larger than the actual size in FIG. 15 for the purpose of easy understanding of disposition of the resin 22.

EXAMPLE 7

Plural sensor substrates 20 are bonded followed by flattening in Example 7 according to the present invention.

Figure 16A:
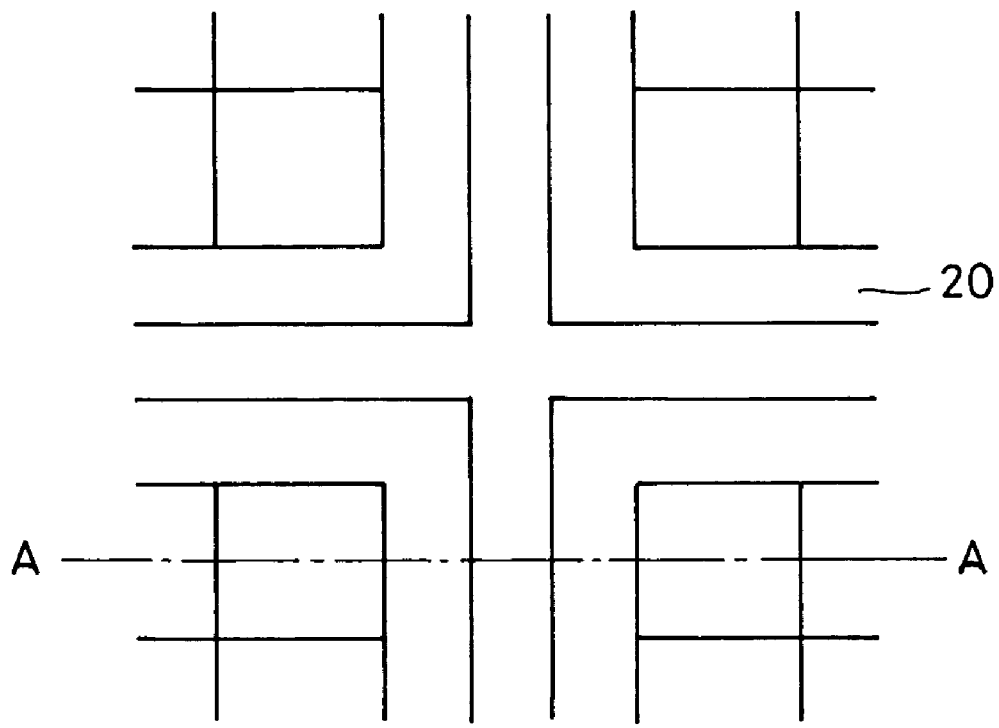
FIG. 16A denotes a schematic plane view of an example showing the arrangement of the sensor substrates.
Figure 16B:
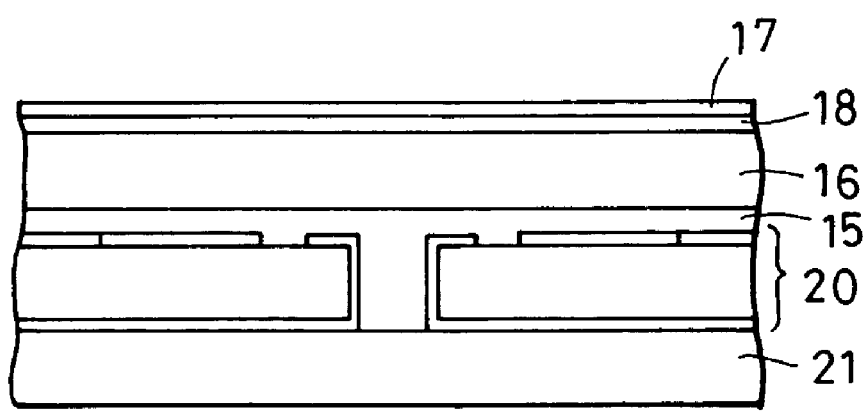
FIG. 16B denotes a schematic cross section of a part of the image pick-up apparatus.

A polyimide flattening layer 15 is coated after bonding plural substrates 20 on the substrate 21 as shown in FIG. 16A and FIG. 16B. The crossing portion after bonding, or the gap between the sensor substrates 20, is once filled with the polyimide resin using a dispenser, followed by spin-coating the polyimide resin again over the entire surface of the substrate to form a flattening layer 15. Then, a scintillator layer 16 such as a CsI layer is deposited and an Al film 17 is formed after coating a second polyimide layer 18 on the scintillator layer 16.

A black resin may be coated on the end face of the substrate and a part of the substrate (not shown) before bonding the substrate.

It is needless to say that the polyimide film 18 and Al film 17 may be formed on the end face of the scintillator, or the end face of the image pick-up device may be covered with a metal foil such as an aluminum foil.

Although the PIN type photodiode sensor is used as the photoelectric conversion element in the examples as hitherto described, a MIS type photosensor having the same construction as TFT may be used. An example of the X-ray image pick-up apparatus using the MIS type photosensor is disclosed in Japanese Patent Laid-open No. 7-250512.

Figure 17A:
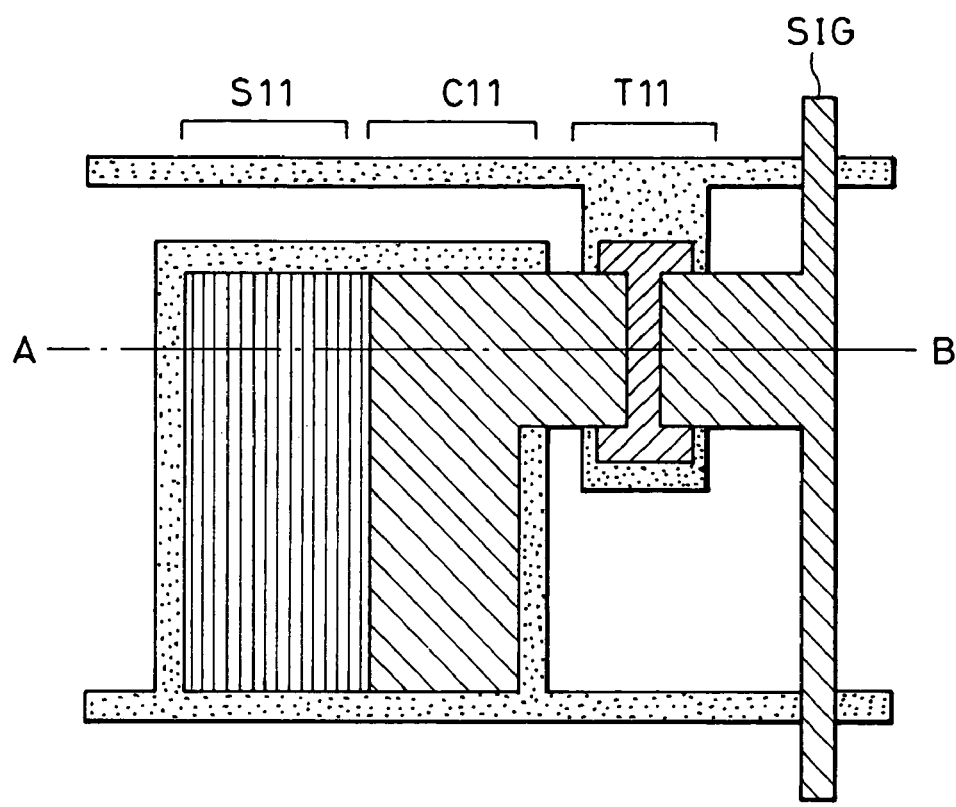
FIG. 17A denotes a schematic plane view for describing another example of the sensor (a pixel).
Figure 17B:
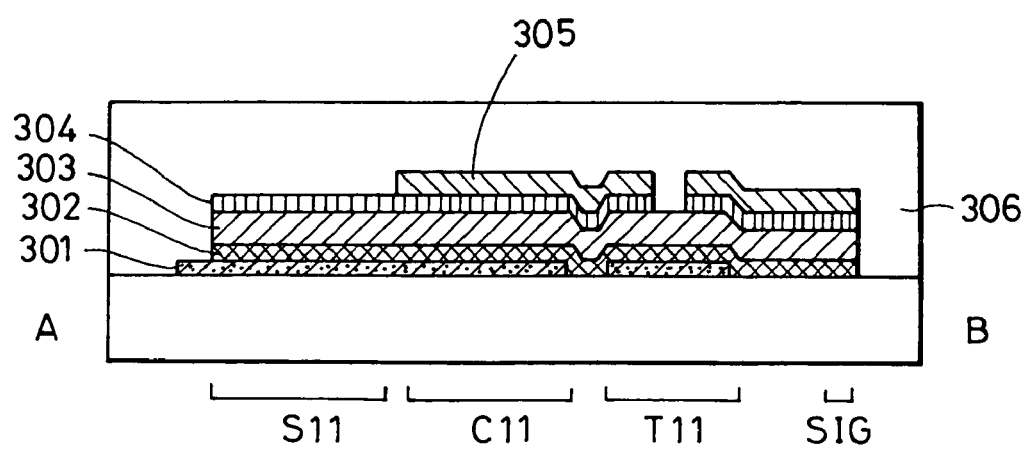
FIG. 17B denotes a schematic cross section of the sensor.

FIG. 17A shows a schematic plane view of the portion corresponding to one pixel while FIG. 17B shows a schematic cross section of the portion indicated by a dot-in-broken line in FIG. 17A.

The reference mark S11 denotes a photoelectric conversion element, the reference mark T11 denotes a TFT, the reference mark C11 denotes a capacitor and the reference numeral SIG denotes a signal line. The reference numeral 301 denotes a lower electrode formed of Al or Cr provided on an insulation substrate such as a glass plate. The reference numeral 302 denotes an insulation layer made of, for example, silicon nitride (SiN) that prevents permeation of electrons and holes. The thickness of the insulation layer is adjusted to 500 A or more that is a thickness enough for preventing permeation of electrons and holes by a tunnel effect. The reference numeral 303 denotes a photoelectric conversion semiconductor layer formed of an i-layer of an intrinsic semiconductor such as hydrogenated amorphous silicon (a-Si:H). The reference numeral 304 denotes an injection preventive layer formed of a $n^+$-layer of a-Si for preventing injection of holes from a transparent electrode 305 side to the photoelectric conversion semiconductor layer 303. The transparent electrode 305 is made of a compound or an oxide containing indium or tin such as ITO. The reference numeral 306 denotes a SiN protective film.

It is clear from FIG. 17B that the photoelectric conversion element S11 has the same construction as the TFT T11, and elements in the capacitor C11 and photoelectric conversion element S11 are not especially isolated or independent with each other but the capacitor C11 is formed by expanding the electrode area of the photoelectric conversion element S11.

An example of packaging of the X-ray image pick-up apparatus and a X-ray image pick-up apparatus according to the present invention will be described below.

Figure 18A:
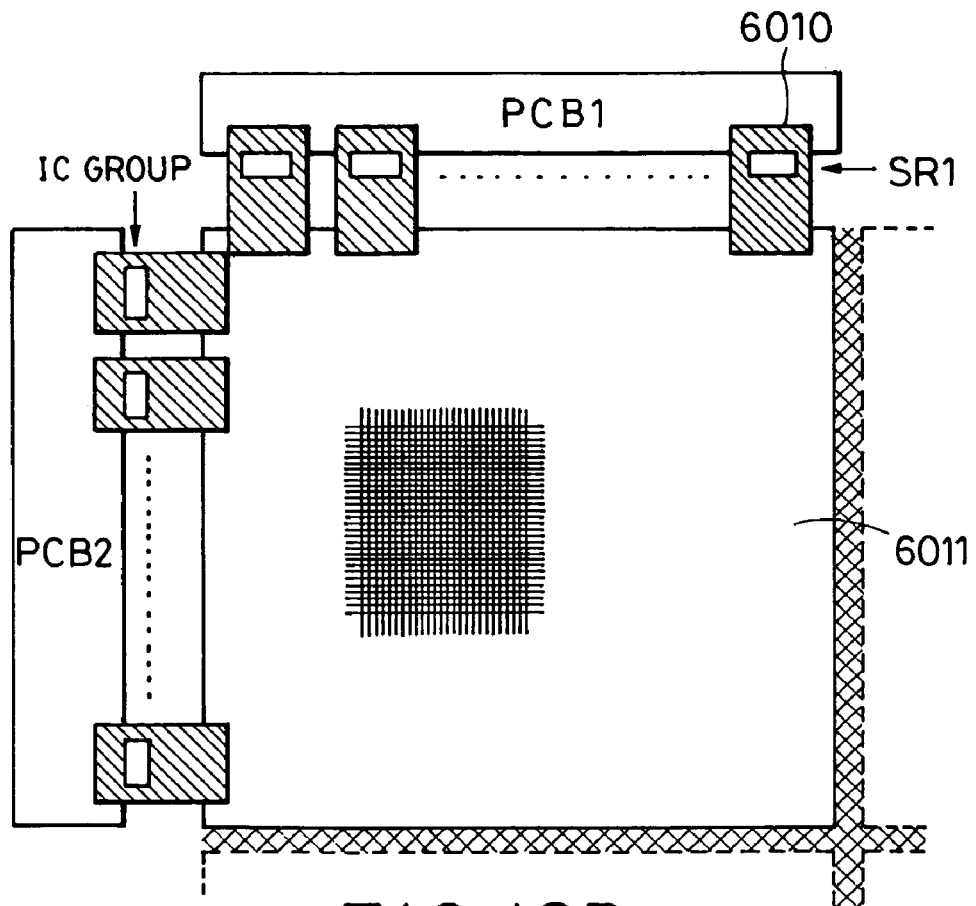
FIG. 18A denote a schematic plane view for describing an example of disposition of the sensor and peripheral circuits in the image pick-up apparatus.
Figure 18B:
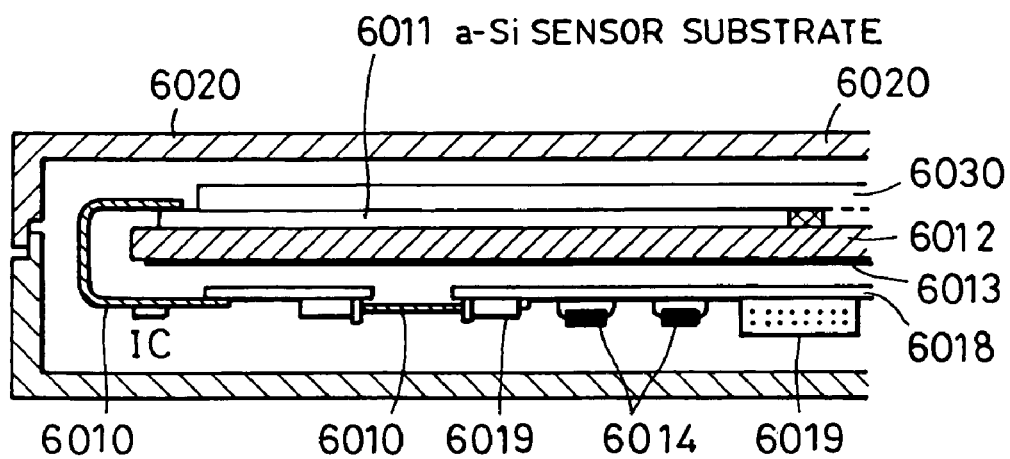
FIG. 18B denotes a schematic cross section of the image pick-up apparatus.

FIG. 18A and FIG. 18B denote a schematic construction and cross section of packaging of the X-ray image pick-up apparatus according to the present invention.

Plural photoelectric conversion elements and TFTs are formed on a sensor substrate 6011 forming a matrix. A shift resistor SRI and image pick-up integrated circuit IC are packaged on a flexible circuit board 6010 connected to the periphery of the sensor substrate 6011. The back face of the flexible circuit board 6010 is connected to the circuit boards PCB1 and PCB2. Plural sheets of the sensor susbtrate 6011 are bonded to a substrate 6012, while a lead plate 6013 for protecting memories 6014 in a data processing circuit 6018 from x-ray is packaged under the substrate 6012 constituting the large area photoelectric converter. A scintillator 6030 such as CsI as a wavelength converter for converting X-ray into visible light is deposited on the sensor susbtrate 6011 after flattening the substrate. The overall system is housed in a case 6020 made of a carbon fiber as shown in FIG. 18B.

Figure 19:
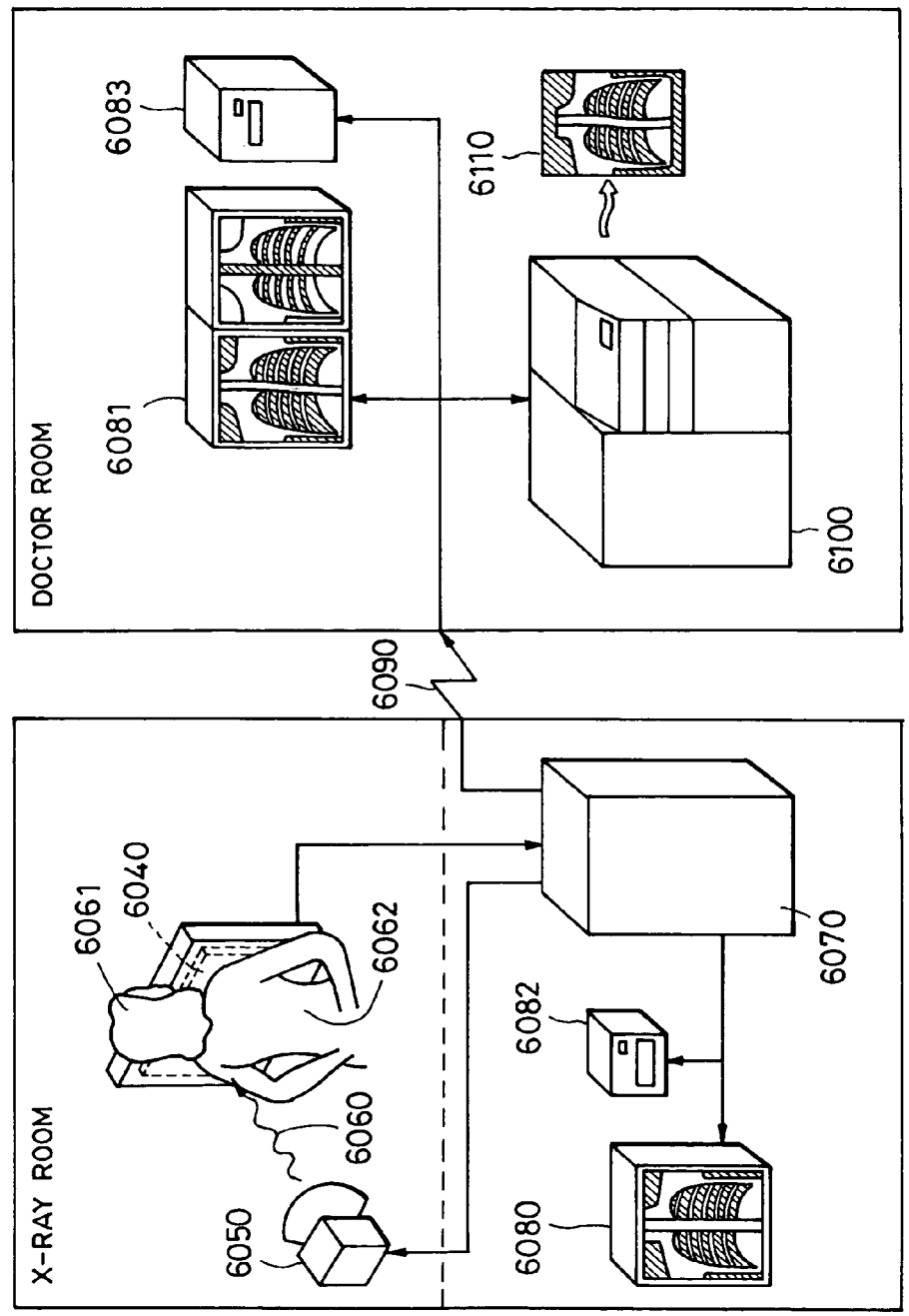
FIG. 19 shows an illustrative drawing for describing an example of the image pick-up system.

FIG. 19 illustrates an example of the X-ray image pick-up apparatus applied to a X-ray diagnosis system.

x-ray emitted from a X-ray tube 6050 transmits the chest 6062 of a patient or examination subject 6061 and impinges a photoelectric converter 604 on which the scintillator is packaged. The incident X-ray involves information in the body of the patient 6061. The scintillator emits a light in response to the incident X-ray, the light being converted into electric signals to obtain electric information. The information is converted to digital signals that are subjected to image processing to obtain an image observable on a display 6080 in the control room.

This information can be also transferred to a remote site with a transmission mean such as a telecommunication network, or can be watched on a display 6081 installed at a separated doctor room to enable a doctor residing at a remote site to make a diagnosis. The information can be of course either stored on storage 6082 and 6083 such as an optical disk, or recorded on a film 6110 with a film processor 6100.

As hitherto described, crystallinity of CsI constituting the scintillator layer as a wavelength converter can be improved according to the present invention. Moreover, a highly reliable reflection film and protective film can be manufactured by flattening the surface roughness of the CsI scintillator layer.

When the apparatus is manufactured by bonding plural sensor substrates, it is possible to uniformly form the CsI scintillator layer on the plural substrates.

Consequently, substantial aperture ration can be enhanced to provide a highly sensitive and high-speed image pick-up apparatus.

The wavelength converter according to the present invention has excellent characteristics owing to improved and uniform crystallinity of CsI with good repeatability, thereby making it possible to prevent sensitivity from being distributed to enable an excellent image information to be obtained.

A high reliable image pick-up apparatus with good durability can be manufactured with good yield according to the present invention, making it possible to manufacture the apparatus with low production cost.

What is claimed is:

1. An image pick-up apparatus comprising:
a plurality of photoelectric conversion elements and TFTs arranged on an insulating substrate, wherein the photoelectric conversion elements and TFTs comprise an amorphous silicon film formed on the insulating substrate, and surface areas of the photoelectric conversion elements are higher than peripheral areas of the photoelectric conversion elements thereby forming steps;
a wavelength converter positioned and configured to convert incident radiation to light having a wavelength detectable by said photoelectric conversion elements;
a protective layer arranged on the insulating substrate so as to cover said photoelectric conversion elements and said TFTs, wherein the protective layer is formed from an inorganic material, a surface of the protective layer has surface steps corresponding to the photoelectric conversion element steps, and the protective layer is arranged in a wider area compared to the area where the photoelectric conversion elements and TFTs are arranged; and
a flattening layer arranged on the surface of the protective layer;
wherein the flattening layer is formed from an organic material;
wherein the flattening layer is arranged in a wider area compared to the area where the wavelength converter is arranged;
wherein a thickness of the flattening layer is thicker than that of the protective layer;
wherein a surface of the flattening layer is flatter than the surface of the protective layer; and
wherein the wavelength converter comprises a columnar crystal scintillator deposited on the surface of the flattening layer.

2. An image pick-up apparatus according to claim 1, wherein the flattening layer is obtained by flattening the protective layer provided on the insulating substrate.

3. An image pick-up apparatus according to claim 1, wherein the flattening layer comprises a polyimide resin.

4. An image pick-up apparatus according to claim 1, wherein an additional flattening layer is provided on the wavelength converter.

5. An image pick-up apparatus according to claim 4, wherein the additional flattening layer covers the end face of the wavelength converter.

6. An image pick-up apparatus according to claim 4, wherein a light reflection film is provided on the additional flattening layer.

7. An image pick-up apparatus according to claim 6, wherein the light reflection film is made of an aluminum film.

8. An image pick-up apparatus according to claim 1, wherein the surface of the wavelength converter is flattened.

9. An image pick-up apparatus according to claim 8, wherein a light reflection film is provided on the wavelength converter.

10. An image pick-up apparatus according to claim 9, wherein the light reflection film is made of an aluminum film.

11. An image pick-up apparatus according to claim 9, having plural insulating substrates.

12. An image pick-up apparatus according to claim 1, wherein the scintillator comprises a CsI crystal.

13. The image pick-up apparatus according to claims 1, wherein the photoelectric conversion elements comprise an amorphous silicon film.

14. An image pick-up apparatus according to claim 1, wherein the protective layer comprises SiN.

15. An image pick-up apparatus comprising:
comprising:
a plurality of insulating substrates arranged on a substrate;
a plurality of photoelectric conversion elements and TFTs, arranged on each of the insulating substrates, wherein the photoelectric conversion elements and TFTs comprise an amorphous silicon film formed on the insulating substrates, and surface areas of the photoelectric conversion elements are higher than peripheral areas of the photoelectric conversion elements thereby forming steps;
a wavelength converter configured and positioned to convert incident radiation to light having a wavelength detectable by the photoelectric conversion elements;
a protective layer arranged on the insulating substrates so as to cover the photoelectric conversion elements and the TFTs, wherein the protective layer is formed from an inorganic material, a surface of the protective layer has surface steps corresponding to the photoelectric conversion element steps, and the protective layer is arranged in a wider area compared to the area where the photoelectric conversion elements and TFTs are arranged; and
a flattening layer arranged on a surface of the protective layer,
wherein the flattening layer is formed from an organic material,
wherein the flattening layer is arranged in a wider area compared to the area where the wavelength converter is arranged,
wherein a thickness of the flattening layer is thicker than that of the protective layer,
wherein a surface of the flattening layer is flatter than the surface of the protective layer, and
wherein the wavelength converter comprises a columnar crystal scintillator deposited on surface of the flattening layer.

16. An image pick-up apparatus according to claim 15, wherein the flattening layer is obtained by flattening the protective layer provided on the insulating substrates.

17. An image pick-up apparatus according to claim 15, wherein the flattening layer comprises a polyimide resin.

18. An image pick-up apparatus according to claim 15, wherein the flattening layer is arranged on the plurality of insulating substrates.

19. An image pick-up apparatus according to claim 15, wherein the scintillator comprises a CsI crystal.

20. An image pick-up apparatus according to claim 15, wherein the protective layer comprises SiN.

21. An image pick-up system comprising:
an image pick-up apparatus including: a plurality of photoelectric conversion elements and TFTs arranged on an insulating substrate, wherein the photoelectric conversion elements and TFTs comprise an amorphous silicon film formed on the insulating substrate, and surface areas of the photoelectric conversion elements are higher than peripheral areas of the photoelectric conversion elements thereby forming steps; a wavelength converter configured and positioned to convert incident radiation to light having a wavelength detectable by the photoelectric conversion elements; a protective layer arranged on the substrate so as to cover the photoelectric conversion elements and the TFTs, wherein the protective layer is formed from an inorganic material, a surface of the protective layer has surface steps corresponding to the photoelectric conversion element steps, and the protective layer is arranged in a wider area compared to the area where the photoelectric conversion elements and TFTs are arranged; and a flattening layer on a surface of the protective layer;
wherein said flattening layer is formed from an organic material, wherein the flattening layer is arranged in a wider area compared to the area where the wavelength converter is arranged;
wherein a thickness of the flattening layer is thicker than that of the protective layer;
wherein a thickness of the flattening layer is thicker than that of the protective layer,
wherein a surface of the flattening layer is flatter than the surface of the protective layer, and
wherein the wavelength converter is comprises a columnar crystal scintillator deposited on the surface of the flattening layer;
a signal processor configured to process the signal from the image pick-up apparatus; and
a display configured to display the processed signal from the signal processor.

22. An image pick-up system according to claim 21, further comprising a telecommunication device configured to transfer the signal from the signal processor.

23. An image pick-up apparatus system to claim 21, further comprising a recorder configured to record the signal from the signal processor.

24. An image pick-up system according to claim 21, further comprising a storage device configured to store the signal from the signal processor.

25. An image pick-up system comprising:
a plurality of insulating substrates arranged on a substrate;
a plurality of photoelectric conversion elements and TFTs, arranged on each of the insulating substrates wherein the photoelectric conversion elements and TFTs comprise an amorphous silicon film formed on the insulating substrates, and surface areas of the photoelectric conversion elements are higher than peripheral areas of the photoelectric conversion elements thereby forming steps; a wavelength converter configured and positioned to convert incident radiation to light having a wavelength detectable by the photoelectric conversion elements; a protective layer arranged on the insulating substrates so as to cover the plurality of photoelectric conversion elements and TFTs, wherein the protective layer is formed from an inorganic material, a surface of the protective layer has surface steps corresponding to the photoelectric conversion element steps, and the protective layer is arranged in a wider area compared to the area where the photoelectric conversion elements and TFTs are arranged; and an flattening layer arranged on a surface of the protective layer;

wherein said flattening layer is formed from an organic material, wherein the flattening layer is arranged in a wider area compared to the area where the wavelength converter is arranged;

wherein a thickness of the flattening layer is thicker than that of the protective layer, wherein a surface of the flattening layer is flatter from the surface of the protective layer, and wherein the wavelength converter comprises a columnar crystal scintillator deposited on the surface of the flattening layer;

a signal processor configured to process the signal from the image pick-up apparatus; and a display configured to display the processed signal from the signal processing means.

26. An image pick-up system according to claim 25, further comprising a recorder configured to record the processed signal from the signal processor.

27. An image pick-up system according to claim 25, further comprising a telecommunication device configured to transfer the signal from the signal processor.

28. An image pick-up system according to claim 25, further comprising a storage device configured to store the signal from the signal processor.

* * * * *

UNITED STATES PATENT AND TRADEMARK OFFICE
CERTIFICATE OF CORRECTION

PATENT NO. : 7,102,676 B1
APPLICATION NO. : 09/422792
DATED : September 5, 2006
INVENTOR(S) : Chiori Mochizuki It is certified that error appears in the above-identified patent and that said Letters Patent is hereby corrected as shown below:

COLUMN 1

Line 38, "considering." should read --consideration--; and
Line 51, "of" should be deleted.

COLUMN 4

Line 41, "to" should be deleted; and
Line 52, "a" should read --an--.

COLUMN 5

Line 5, "show" should read --shows--; and
Line 9, "denote" (both occurrences) should read --denotes--.

COLUMN 6

Line 56, "a" should be deleted.

COLUMN 7

Line 40, "demonstrates" should read --demonstrate--.

COLUMN 8

Line 12, "SIN" should read --SiN--.

COLUMN 9

Line 10, "that is" should read --: that is,--;
Line 50, "a" should read --an--;
Line 51, "x-ray" should read --An X-ray--; and "a" should read --an--.

COLUMN 10

Line 10, "ration" should read --ratio--.

UNITED STATES PATENT AND TRADEMARK OFFICE
CERTIFICATE OF CORRECTION

PATENT NO. : 7,102,676 B1
APPLICATION NO. : 09/422792
DATED : September 5, 2006
INVENTOR(S) : Chiori Mochizuki It is certified that error appears in the above-identified patent and that said Letters Patent is hereby corrected as shown below:

COLUMN 11

Line 11, "claims 1," should read --claim 1,--;
    Line 27, "comprising:" should be deleted; and
    Line 63, "on" should read --on the--.

COLUMN 12

Line 42, "is" should be deleted;
    Line 52, "apparatus system" should read --system according--; and
    Lines 38-39, lines 38-39 should be deleted.

COLUMN 13

Line 11, "an" should read --a--.

COLUMN 14

Line 1, "from" should read --than--.

Signed and Sealed this

Sixth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 7,102,676 B1
APPLICATION NO. : 09/422792
DATED : September 5, 2006
INVENTOR(S) : Chiori Mochizuki It is certified that error appears in the above-identified patent and that said Letters Patent is hereby corrected as shown below:

COLUMN 1

Line 38, "considering." should read --consideration--; and
Line 51, "of" should be deleted.

COLUMN 4

Line 41, "to" should be deleted; and
Line 52, "a" should read --an--.

COLUMN 5

Line 5, "show" should read --shows--; and
Line 9, "denote" (both occurrences) should read --denotes--.

COLUMN 6

Line 56, "a" should be deleted.

COLUMN 7

Line 40, "demonstrates" should read --demonstrate--.

COLUMN 8

Line 12, "SIN" should read --SiN--.

COLUMN 9

Line 10, "that is" should read --: that is,--;
Line 50, "a" should read --an--;
Line 51, "x-ray" should read --An X-ray--; and "a" should read --an--.

UNITED STATES PATENT AND TRADEMARK OFFICE
CERTIFICATE OF CORRECTION

PATENT NO. : 7,102,676 B1
APPLICATION NO. : 09/422792
DATED : September 5, 2006
INVENTOR(S) : Chiori Mochizuki It is certified that error appears in the above-identified patent and that said Letters Patent is hereby corrected as shown below:

COLUMN 10

Line 10, "ration" should read --ratio--.

COLUMN 11

Line 11, "claims 1," should read --claim 1,--;
Line 27, "comprising:" should be deleted; and
Line 63, "on" should read --on the--.

COLUMN 12

Line 42, "is" should be deleted;
Line 52, "apparatus system" should read --system according--; and
Lines 38-39, lines 38-39 should be deleted.

COLUMN 13

Line 11, "an" should read --a--.

COLUMN 14

Line 1, "from" should read --than--.

Signed and Sealed this

Twenty-fifth Day of December, 2007

JON W. DUDAS
*Director of the United States Patent and Trademark Office*